(12) United States Patent
Nakamura et al.

(10) Patent No.: US 9,324,808 B2
(45) Date of Patent: Apr. 26, 2016

(54) SEMICONDUCTOR DEVICE, POWER-SUPPLY UNIT, AMPLIFIER AND METHOD OF MANUFACTURING SEMICONDUCTOR DEVICE

(71) Applicant: Fujitsu Limited, Kawasaki (JP)

(72) Inventors: Norikazu Nakamura, Kawasaki (JP); Shirou Ozaki, Kawasaki (JP); Masayuki Takeda, Kawasaki (JP); Keiji Watanabe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/902,788

(22) Filed: May 25, 2013

(65) Prior Publication Data

US 2013/0256693 A1 Oct. 3, 2013

Related U.S. Application Data

(62) Division of application No. 13/369,409, filed on Feb. 9, 2012, now Pat. No. 8,487,384.

(30) Foreign Application Priority Data

Feb. 16, 2011 (JP) .................. 2011-031109

(51) Int. Cl.
*H01L 29/51* (2006.01)
*H01L 29/778* (2006.01)
(Continued)

(52) U.S. Cl.
CPC ....... *H01L 29/2003* (2013.01); *H01J 37/32357* (2013.01); *H01L 21/28264* (2013.01); *H01L 23/291* (2013.01); *H01L 23/3171* (2013.01); *H01L 29/41766* (2013.01); *H01L 29/4236* (2013.01); *H01L 29/42364* (2013.01); *H01L 29/51* (2013.01); *H01L 29/513* (2013.01); *H01L 29/517* (2013.01); *H01L 29/66462* (2013.01); *H01L 29/66477* (2013.01);
(Continued)

(58) Field of Classification Search
CPC ............. H01L 29/778; H01L 29/7781; H01L 29/7786; H01L 29/7787; H01L 23/29; H01L 23/291; H01L 23/293
See application file for complete search history.

(56) References Cited

U.S. PATENT DOCUMENTS 5,196,907 A 3/1993 Birkle et al.
5,601,902 A * 2/1997 Hammerschmidt et al. .. 428/209
(Continued)

FOREIGN PATENT DOCUMENTS

CN 1750392 3/2006
CN 101548368 9/2009
(Continued)

OTHER PUBLICATIONS

Robertson. Diamond-like carbon. 1994. Pure & Appl. Chem., vol. 66, No. 9, pp. 1789-1796.*
(Continued)

*Primary Examiner* — Robert Bachner
*Assistant Examiner* — Molly Reida
(74) *Attorney, Agent, or Firm* — Fujitsu Patent Center

(57) ABSTRACT

A semiconductor device, includes a semiconductor layer formed above a substrate; an insulating film formed on the semiconductor layer; and an electrode formed on the insulating film. The insulating film has a membrane stress at a side of the semiconductor layer lower than a membrane stress at a side of the electrode.

4 Claims, 17 Drawing Sheets

(51) Int. Cl.
  *H01L 29/20* (2006.01)
  *H01L 23/29* (2006.01)
  *H01L 23/31* (2006.01)
  *H01L 29/417* (2006.01)
  *H01L 29/423* (2006.01)
  *H01L 29/66* (2006.01)
  *H01L 21/28* (2006.01)
  *H01J 37/32* (2006.01)
  *H01L 29/78* (2006.01)

(52) U.S. Cl.
  CPC ....... *H01L 29/7786* (2013.01); *H01L 29/7787* (2013.01); *H01L 29/78* (2013.01); *H01L 2224/0603* (2013.01); *H01L 2224/48247* (2013.01); *H01L 2224/48257* (2013.01); *H01L 2224/48472* (2013.01); *H01L 2224/4903* (2013.01); *H01L 2924/181* (2013.01)

(56) References Cited

U.S. PATENT DOCUMENTS

| | | | |
|---|---|---|---|
| 6,927,435 | B2 | 8/2005 | Moriya et al. |
| 6,989,332 | B1* | 1/2006 | Bell et al. ............... 438/719 |
| 7,220,687 | B2* | 5/2007 | Won ............... 438/792 |
| 7,521,304 | B1 | 4/2009 | Huang et al. |
| 7,652,282 | B2 | 1/2010 | Yanagihara |
| 8,053,849 | B2 | 11/2011 | Pan et al. |
| 8,450,782 | B2 | 5/2013 | Sato et al. |
| 8,569,800 | B2 | 10/2013 | Ikeda et al. |
| 2003/0129298 | A1* | 7/2003 | Tera et al. ............ 427/66 |
| 2004/0247949 | A1* | 12/2004 | Akedo et al. ............ 428/704 |
| 2005/0194662 | A1* | 9/2005 | Schmidt et al. .......... 257/646 |
| 2007/0102776 | A1 | 5/2007 | Pan et al. |
| 2008/0196664 | A1* | 8/2008 | David et al. ............ 118/623 |
| 2010/0024873 | A1* | 2/2010 | Mahrize ............ 136/255 |
| 2010/0032838 | A1 | 2/2010 | Kikuchi et al. |
| 2011/0121409 | A1 | 5/2011 | Seo et al. |
| 2012/0043625 | A1 | 2/2012 | Seo et al. |
| 2012/0049196 | A1 | 3/2012 | Pan et al. |

FOREIGN PATENT DOCUMENTS

| | | |
|---|---|---|
| JP | 01-187933 | 7/1989 |
| JP | 04-006835 | 1/1992 |
| JP | 05-335345 | 12/1993 |
| JP | 07161474 A * | 6/1995 |
| JP | 2002-217410 | 8/2002 |
| JP | 2002-359256 | 12/2002 |
| JP | 2003-045996 | 2/2003 |
| JP | 2008-218479 | 9/2008 |
| JP | 2009-054807 | 3/2009 |
| JP | 2009054807 A * | 3/2009 |
| JP | 2010-232610 | 10/2010 |
| JP | 2010-258441 | 11/2010 |

OTHER PUBLICATIONS

Imada et al., Enhancement-Mode GaN MIS-HEMTs for Power Supplies, 2010, The 2010 International Power Electronics Conference. pp. 1027-1033.*
Aethercomm, Gallium Nitride HEMTs for High Efficiency Power Amplifiers, May 2007, Microwave Product Digest.*
USPTO, (REIDA) Notice of Allowance and Notice of Allowability, Apr. 12, 2013, in parent application U.S. App. No. 13/369,409 [Allowed].
USPTO, (REICA) Election/Restriction Requirement, Feb. 4, 2013, in parent application U.S. Appl. No. 13/369,409 [Allowed].
Office Action dated Feb. 25, 2014 issued with respect to the corresponding Chinese Patent Application No. 201210033132.5, with English translation.
JPOA—Office Action dated Jul. 29, 2014 issued with respect to Japanese Patent Application No. 2011-031109 with English-language translation.
TWOA—Office Action dated Jun. 4, 2015 issued with respect to the corresponding R.O.C / Taiwanese Patent Application No. 101103746, with full English translation.

* cited by examiner

SEMICONDUCTOR DEVICE, POWER-SUPPLY UNIT, AMPLIFIER AND METHOD OF MANUFACTURING SEMICONDUCTOR DEVICE

CROSS-REFERENCE TO RELATED APPLICATIONS

This application is a divisional of application Ser. No. 13/369,409, filed Feb. 9, 2012, which is based upon and claims the benefit of priority of the prior Japanese Patent Application No. 2011-031109, filed on Feb. 16, 2011, the entire contents of which are incorporated herein by reference.

FIELD

In the description below, a semiconductor device, a power-supply unit, an amplifier and a method of manufacturing a semiconductor device will be explained with reference to embodiments.

BACKGROUND

GaN, AlN and InN which are nitride semiconductors, and materials including mix crystals thereof have wide band gaps, and may be used in high power electronic devices, short wavelength light-emitting devices or such. Thereamong, as a high power electronic device, a technology of a field effect transistor (FET), in particular, a high electron mobility transistor (HEMT), has been developed. Such a HEMT using a nitride semiconductor may be used in a high power and high efficiency amplifier, a high power switching device or such.

Since it is preferable that a HEMT used for such a purpose has a high drain withstand voltage and/or gate withstand voltage, a metal insulator semiconductor (MIS) structure, in which an insulating film to be used as a gate insulating film is formed, is used in many cases. By using such a MIS structure, it is possible to provide a semiconductor device suitable as a power semiconductor device.

Further, in a semiconductor device of such a field effect transistor, a protective film made of an insulator may usually be formed on the entire area of the surface after a gate electrode, a drain electrode or such is formed for the purpose of passivation or such.

PRIOR ART REFERENCES

Patent References

Patent Reference 1 Japanese Laid-Open Patent Application No. 2002-359256
Patent Reference 2 Japanese Laid-Open Patent Application No. 2008-218479

SUMMARY

In an aspect, there is provided a semiconductor device including a semiconductor layer formed above a substrate; an insulating film formed on the semiconductor layer; and an electrode formed on the insulating film. The insulating film has a membrane stress at a side of the semiconductor layer lower than a membrane stress at a side of the electrode.

Additional objects and advantages of the embodiments will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

DESCRIPTION OF EMBODIMENTS

Figure 1:
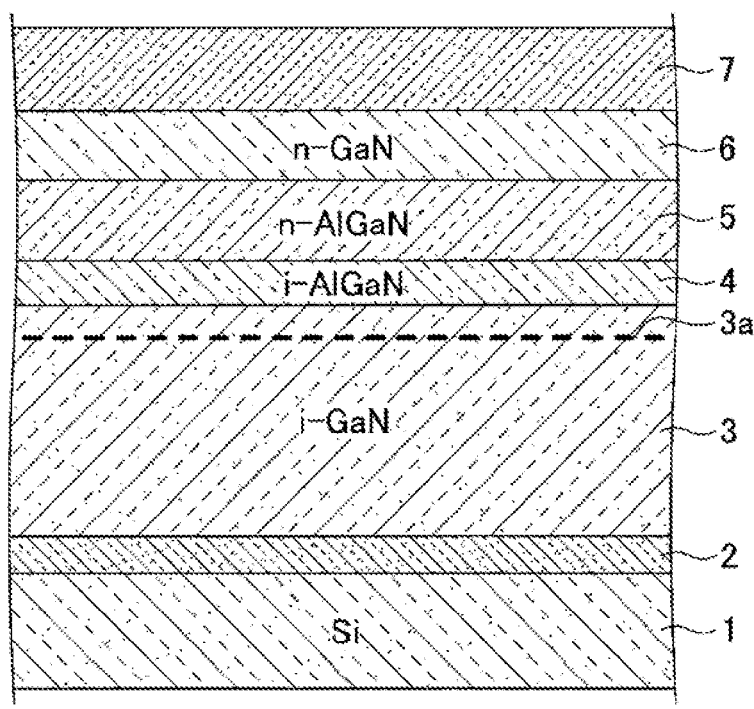
FIG. 1 depicts a structure of a semiconductor device.

In order to realize a power switching device having high efficiency using a transistor, it is preferable to reduce the on-resistance, realize normally-off operations and increase the withstand voltage. Further, it is preferable to provide a switching device having high process yield and high reliability.

That is, as a semiconductor device in which an insulating film to be used as a gate insulating film is formed between a gate electrode and a semiconductor layer, or a semiconductor device in which an insulating film to be used as a protective film is formed, it is preferable to provide a semiconductor device having high reliability and which may be manufactured at high process yield, and provide a method of manufacturing for such a semiconductor device. Further, it is preferable to provide a power-supply unit and an amplifier using such semiconductor devices.

Embodiments of the present invention will be described below. It is noted that as for the same members and so forth, the same reference numerals are given, and description will be omitted.

First Embodiment

First, a gate insulating film formed in a semiconductor device will be described. Specifically, a semiconductor device having a structure similar to that of a HEMT, which is a semiconductor device, was manufactured and a study was carried out. The semiconductor device which was manufactured has a structure in which, as depicted in FIG. 1, on a substrate 1 made of silicon, a buffer layer 2, an electron transit layer 3, a spacer layer 4, an electron supply layer 5 and a cap layer 6 are laminated, and further, an insulating film 7 is formed on the cap layer 6. The electron transit layer 3, spacer layer 4, electron supply layer 5 and cap layer 6 are formed by a metal-organic vapor phase epitaxy (MOVPE) method. The buffer layer 2 was formed on the substrate 1 for the purpose that the electron transit layer 3 and so forth grow in an epitaxial manner. As a result of forming the buffer layer 2 on the substrate 1, it is possible to cause the electron transit layer 3 and so forth to grow in the epitaxial manner on the buffer layer 2.

The electron transit layer 3 is formed by i-GaN having a thickness of approximately 3 μm, and the spacer layer 4 is formed by i-AlGaN having a thickness of approximately 5 nm. The electron supply layer 5 is formed by n-AlGaN having a thickness of approximately 5 nm, and as an impurity element, silicon (Si) is doped by a concentration of $5 \times 10^{18}$ cm$^{-3}$. The cap layer 6 is formed by n-GaN having a thickness of 10 nm, and as an impurity element, silicon (Si) is doped by a concentration of $5 \times 10^{18}$ cm$^{-3}$. It is noted that in such a structure, usually, in the electron transit layer 3, a 2-dimensional electron gas (2DEG) 3a is formed at a side near the electron supply layer 5. Further, the insulating film 7 corresponds to a gate insulating film, and is formed as a result of a film made of aluminum oxide being formed by approximately 20 nm according to an atomic layer deposition (ALD) method.

Figure 2:
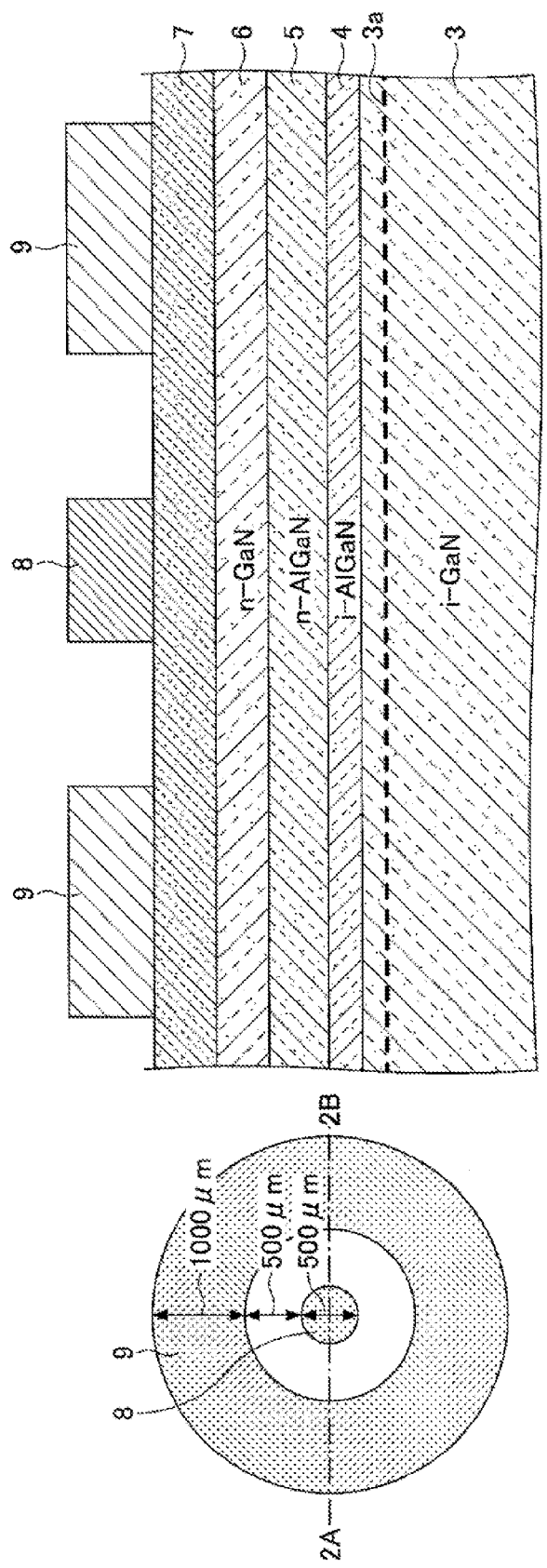
FIGS. 2A and 2B illustrate measurement in a semiconductor device.

On the thus-formed insulating film 7, an anode electrode 8 and a cathode electrode 9 made of mercury were provided, as depicted in FIGS. 2A and 2B, and measurement of the capacity was carried out between the anode electrode 8 and the cathode electrode 9. It is noted that as depicted in FIG. 2A, the anode electrode 8 has a circular shape having a diameter of approximately 500 μm, and the cathode electrode 9 has a donut-like shape having an inner diameter of approximately 1500 μm, and an outer diameter of approximately 3500 μm. The center of the cathode electrode 9 coincides with the center of the anode electrode 8. The cathode electrode 9 is grounded, and has a ground electric potential. FIG. 2A depicts a plan view of this state, and FIG. 2B depicts a sectional view taken by cutting along an alternate long and short dash line 2A-2B in FIG. 2A.

Figure 3:
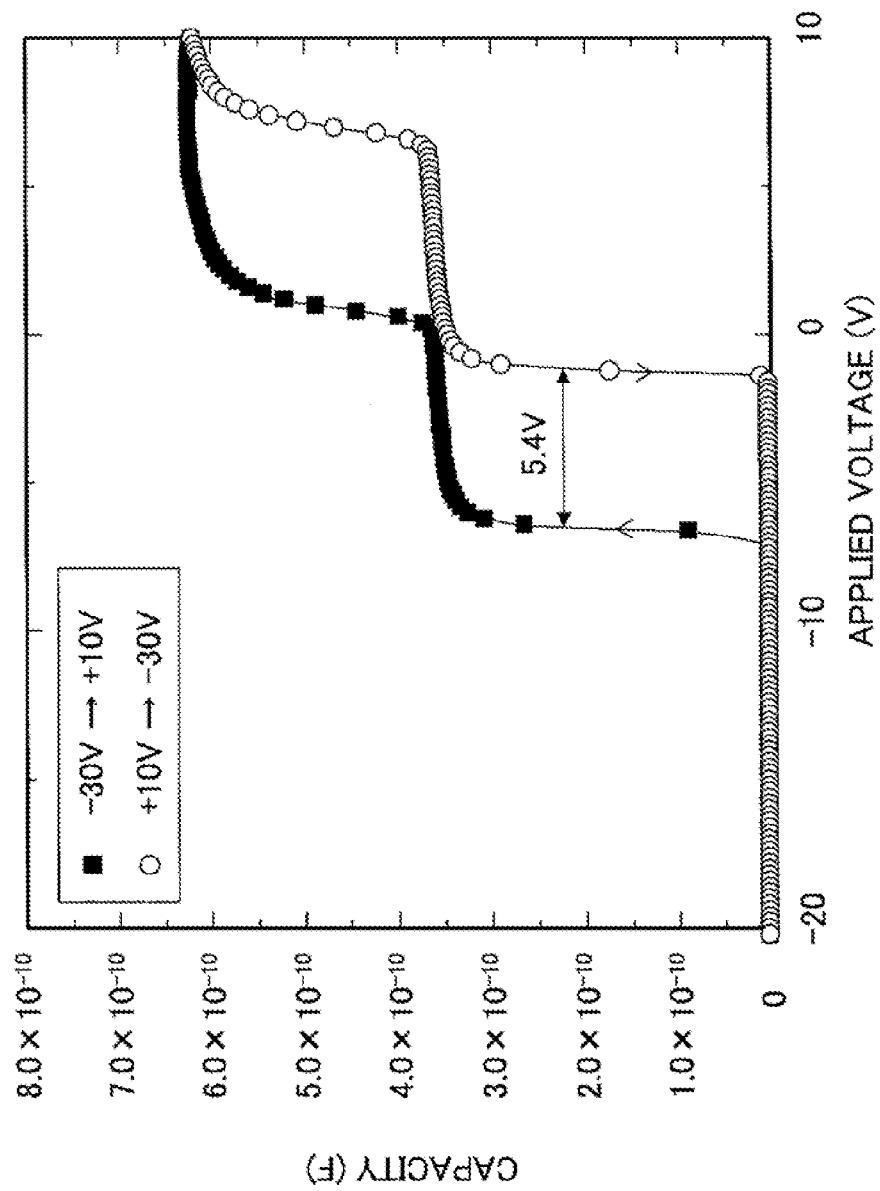
FIG. 3 depicts a correlation between an applied voltage and a capacity.

FIG. 3 depicts a value of the capacity between the anode electrode 8 and the cathode electrode 9 in a case where the voltage applied to the anode electrode 8 is changed. Specifically, in the condition where the cathode 9 is grounded, the applied voltage on which an alternate-current component of 100 kHz and 25 mV is superimposed is applied to the anode electrode 8, and the capacity of the state where the applied voltage is applied is measured.

As depicted in FIG. 3, in a case where the voltage applied to the anode electrode 8 is gradually increased from −30 V to 10 V, the first detected capacity is 0, and the capacity increases sharply around −7 V. After that, even when the applied voltage is further increased, the capacity does not change much, and rather is kept approximately constant. Further, the capacity again increases around 0 V. After that, the capacity increases along with the increase in the applied voltage, and the capacity gradually converges at a fixed value. In contrast thereto, in a case where the voltage applied to the anode electrode 8 is gradually decreased from 10 V to −30 V, the capacity decreases sharply first along with the decrease of the applied voltage. Then, around 7 V, the capacity becomes an approximately fixed value, and, even when the applied voltage is decreased to 0 V, the detected capacity does not change much. After that, when the applied voltage is further decreased, the capacity sharply decreases around after the voltage has passed 0 V, and the detected capacity becomes 0 around −1.5 V. After that, even when the applied voltage is further decreased, the capacity is kept unchanged at 0. Thus, in the semiconductor device depicted in FIG. 1, in the case where the insulating film 7 is formed by aluminum oxide, the curve depicting the relationship between the applied voltage and the capacity differs and shifts between the case where the voltage is increased and the case where the voltage is decreased.

In the above-mentioned case where the applied voltage is increased from the low voltage, the depletion layer thickness reduces, the capacity is generated at the time when the 2DEG 3a is generated in the electron transit layer 3, and the detected capacity increases sharply. On the other hand, in the case where the applied voltage is decreased from the high voltage, the depletion layer thickness increases, and along with a reduction of the 2DEG 3a (see FIG. 1), the detected capacity decreases. The reason why the curve depicting the relationship between the voltage and the capacity differs between the case where the voltage is increased and the case where the applied voltage is decreased seems that a trap level is formed in the insulating film 7 and electrons and so forth are trapped, whereby the distribution of the 2DEG 3a is influenced. That is, in a case where the trap level is formed in the insulating film 7, the detected capacity changes when electrons and so forth are trapped. Therefore, it seems that different capacities are detected even when the same voltage is applied between the case where the applied voltage is increased and the case where the applied voltage is decreased.

If the relationship between the applied voltage and the capacity thus changes depending on the history the past applied voltage, it may not be possible to obtain stable switching operations, and the reliability of the semiconductor device may be degraded. Hereinafter, the amount of shifting of the curve depicting the relationship between the applied voltage and the capacity between the case where the applied voltage is increased and the case where the applied voltage is decreased will be referred to as a threshold voltage change range. It is noted that the threshold voltage change range was approximately 5.4 V as depicted in FIG. 3 in the case where in the semiconductor device described above, the insulting film 7 was formed by aluminum oxide.

It is surmised that such a trap level is easily formed because the aluminum oxide film of the insulating film 7 is an amorphous film of a compound. Therefore, it is surmised that a similar trap level is formed in a case where the insulating film 7 is formed by an amorphous film or such made of a compound of an oxide, nitride or such.

Figure 4A:
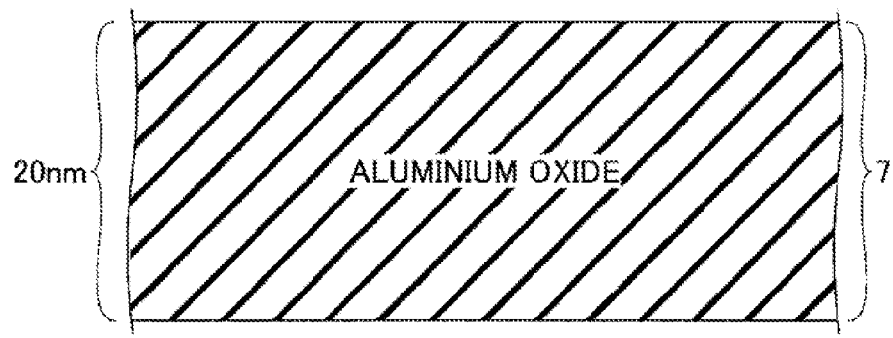
FIGS. 4A, 4B and 4C illustrate insulating films.
Figure 4B:
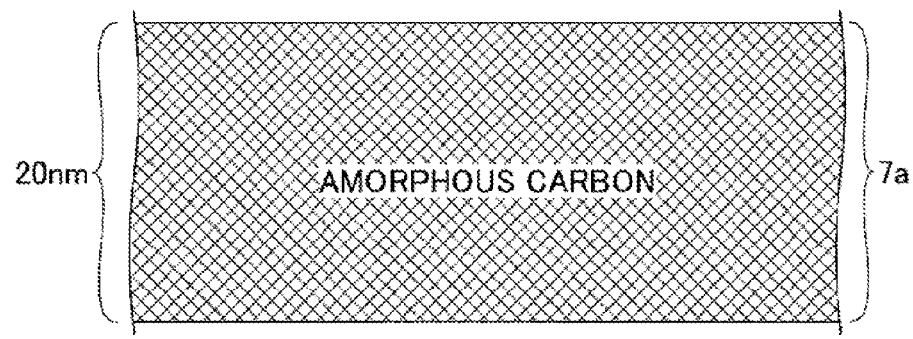

Next, a case where an insulating film is formed by a material other than oxides and nitrides will be described. Specifically, instead of the insulating film 7, a semiconductor device was manufactured in which an insulating film 7a made of an amorphous carbon film depicted in FIG. 4B was formed, and similar measurement was carried out. It is noted that the insulating film 7 depicted in FIG. 4A is formed by aluminum oxide having a film thickness of approximately 20 nm described above. The insulating film 7a depicted in FIG. 4B is formed as a result of an amorphous carbon film being formed by a thickness of approximately 20 nm using filtered cathodic arc (FCA) which is an arc deposition described later. The amorphous carbon film thus formed is an amorphous film of which carbon is the chief ingredient.

When the relationship described above between the applied voltage and the capacity was measured for the semiconductor device in which the insulating layer 7a was formed, the threshold voltage change range was approximately 0 V. Therefore, it seems that stable switching operations can be carried out and high reliability can be obtained in the semiconductor device in which the gate insulating film is formed by the amorphous carbon film.

The amorphous carbon film depicted in FIG. 4B is an amorphous carbon film formed by the FCA method, to which nothing is added, and having a high density, and also very high stress. Therefore, when the amorphous carbon film is formed to have equal to or greater than a certain film thickness, for example, equal to or greater than 20 nm, on the cap layer 6, the then-formed amorphous carbon film may peel from the cap layer 6, and thus, the process yield of manufactured semiconductor devices may be reduced.

Therefore, instead of the insulating film 7, an insulating film 7b including a first amorphous carbon film 7b1 and a second amorphous carbon film 7b2 is formed. The first amorphous carbon film 7b1 is formed as a result of adding nitrogen to an amorphous carbon film with a film thickness of approximately 5 nm. The second amorphous carbon film 7b2 is formed as a result of adding nothing to an amorphous carbon film with a film thickness of approximately 15 nm. When the insulating film 7b having the structure described above was formed on the cap layer 6 with a total film thickness of approximately 20 nm, the insulating film 7b did not peel from the cap layer 6. It is noted that the amorphous carbon films were formed by FCA which is the same arc deposition as in the case depicted in FIG. 4B.

The reason why the insulating film 7b does not peel from the cap layer 6 seems that when nitrogen is added to the first amorphous carbon film 7b1, the stress is reduced, and peeling of the film does not easily occur. That is, it seems that since nitrogen is added to the first amorphous carbon 7b1 formed to be in contact with the cap layer 6 and has a stress lower than that of an amorphous carbon to which nothing is added, the first amorphous carbon 7b1 does not peel from the cap layer 6.

Figure 5:
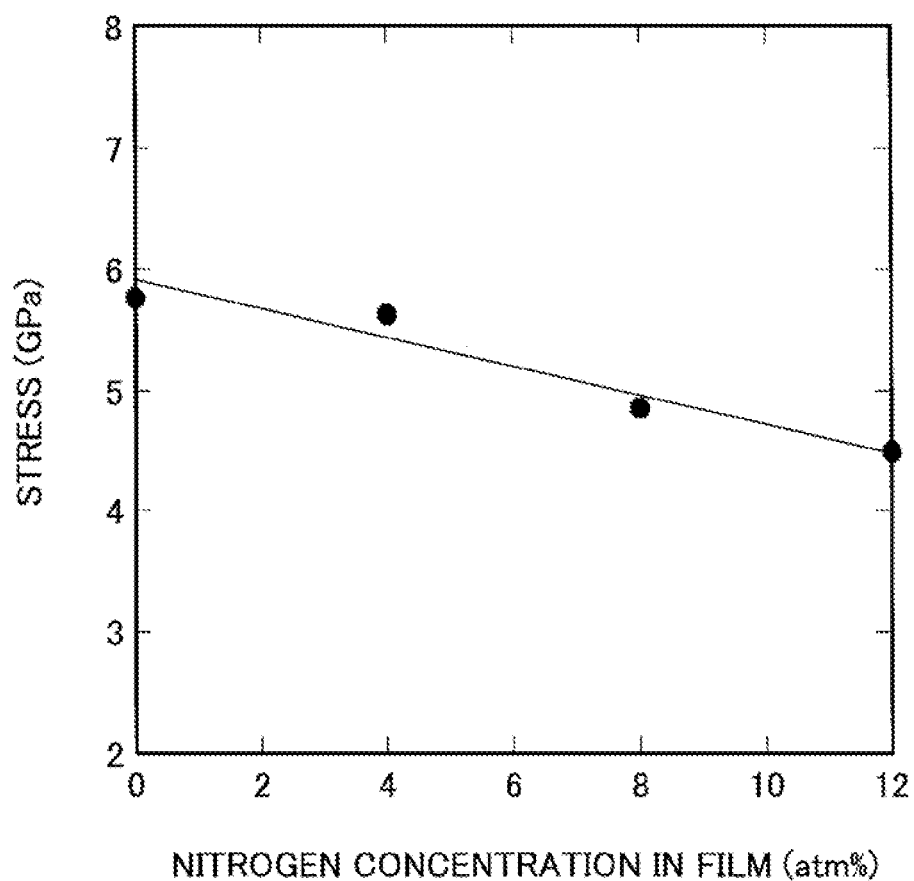
FIG. 5 depicts a correlation between a nitrogen concentration in a film and a stress, in an amorphous carbon film.

FIG. 5 depicts a relationship between the concentration of nitrogen added to an amorphous carbon film and the stress in the amorphous carbon film. As depicted in FIG. 5, the stress decreases as the concentration of nitrogen added to the amorphous film increases. It seems that the decrease of the stress is caused by a reduction of the film density as a result of nitrogen being added to the amorphous carbon film.

In the above description, the case where the insulating film 7b including the two layers is formed has been described. However, in a case where the entirety of an insulating film is formed by the first amorphous carbon film 7b1 only (i.e., the insulating film is formed only by the amorphous carbon film to which nitrogen is added), it seems that peeling of the insulating film does not easily occur in the same manner. Also in this case, it seems that since the stress in the insulating film is low, the insulating film being made of the amorphous carbon to which nitrogen is added and which is in contact with the cap layer 6, the insulating film is not easily peeled from the cap layer 6 and so forth. However, since the insulating film made of the amorphous carbon film to which nitrogen is added has a low density, another problem may occur because the film density of the entirety of the insulating film is thus reduced. Therefore, in order to obtain better characteristics, it is preferable to form the insulating film 7b made of the first amorphous carbon film 7b1 and the second amorphous carbon film 7b2 as depicted in FIG. 4C.

Figure 4C:
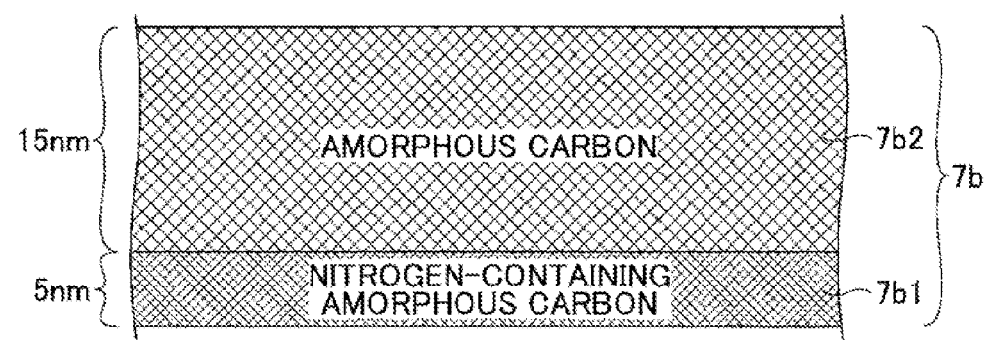

It is noted that in the insulating film 7b made of the first amorphous carbon film 7b1 and the second amorphous carbon film 7b2 as depicted in FIG. 4C, the film having the low stress, i.e., the amorphous carbon film to which nitrogen is added, is formed on the side on which the insulating film comes into contact with the semiconductor layers, i.e., the cap layer 6 and so forth.

Further, in the above description, the amorphous carbon film to which nitrogen is added has been described. However, as an element to be added to an amorphous carbon film, oxygen, hydrogen, fluorine, or such may be cited other than nitrogen. Thereamong, as for an amorphous carbon film to which oxygen is added, the characteristics of the semiconductor device may be degraded as a result of the nitride semiconductor (with which the insulating layer is in contact) and oxygen reacting on one another and resulting in substitution of the oxygen with the nitrogen. Further, as for an amorphous carbon film to which fluorine is added, since a film formed on a film made of a material including fluorine easily peels, the process yield may be degraded. Further, as for an amorphous carbon film to which hydrogen is added, the desired characteristics may not be obtained as a result of the semiconductor layer being influenced by the hydrogen and the characteristics or such being changed. In contrast thereto, as for an amorphous carbon film to which nitrogen is added, since the semiconductor layer is formed by the nitride semiconductor, compatibility between the nitride semiconductor layer and the amorphous carbon film to which nitrogen is added and thus including nitrogen is satisfactory, and it seems that the adhesion therebetween is increased. Therefore, as an element to be added to an amorphous carbon film, nitrogen is preferable.

Further, when the semiconductor device having the insulating film 7b in which the two types of amorphous carbon films are laminated depicted in FIG. 4C was manufactured and measurement was carried out for the relationship between the applied voltage and the capacity, the threshold voltage change range was approximately 0 V the same as in the case of the insulating film 7a depicted in FIG. 4B. Therefore, it seems that a semiconductor device having the same structure as the semiconductor device having the insulating film 7b can carry out stable switching operations, and have high reliability.

(Structure of Semiconductor Device)

Figure 6:
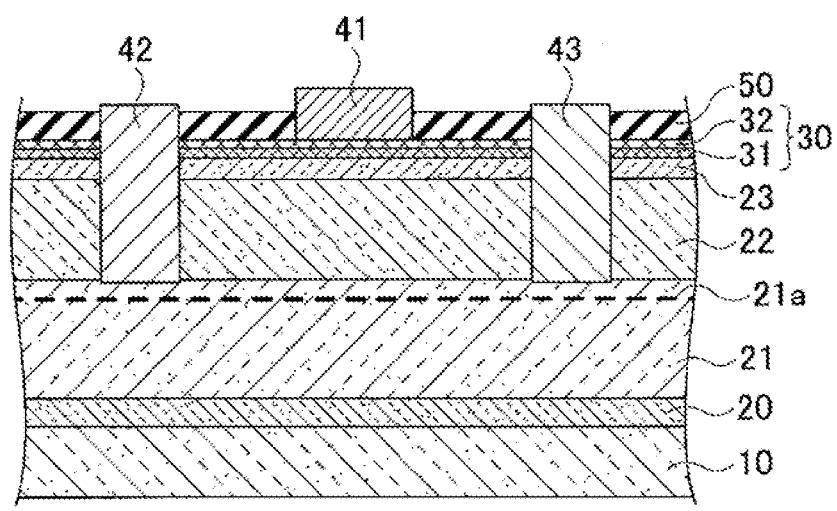
FIG. 6 depicts a structure of a semiconductor device according to a first embodiment.

Next, a semiconductor device according to a first embodiment will be described. FIG. 6 depicts a structure of the semiconductor device according to the first embodiment. The semiconductor device according to the first embodiment is a HEMT, and a buffer layer 20 is formed on a substrate 10 made of a semiconductor or such, and on the buffer layer 20, an electron transit layer 21, an electron supply layer 22 and a cap layer 23, which are semiconductor layers, are formed through epitaxial growth as being laminated. Further, on the cap layer 23, an insulating film 30 is formed, a gate electrode 41 is formed on the insulating film 30, and a source electrode 42 and a drain electrode 43 are formed to be connected with the electron transit layer 21. Further, on the exposed insulating film 30, a protective film 50 made of an insulator is formed.

As the substrate 10, a Si substrate, a SiC substrate, a sapphire ($Al_2O_3$) substrate or such is used. In the first embodiment, a Si substrate is used as the substrate 10, and therefore, the buffer layer 20 is formed. However, in a case where the substrate 10 made of another material is used, there may be a case where it is not necessary to form the buffer layer 20. The electron transit layer 21 as a first semiconductor layer is formed by i-GaN, the electron supply layer 22 as a second semiconductor layer is formed by n-AlGaN, and the cap layer 23 as a third semiconductor layer is formed by n-GaN. As a result, a 2-dimensional electron gas (2DEG) 21a is formed in the electron transit layer 21 at a side near the electron supply layer 22. Further, between the electron transit layer 21 and the electron supply layer 22, a spacer layer (not depicted) may be formed.

The gate electrode 41, source electrode 42 and drain electrode 43 are made of metal materials. The insulating film 30 which is to be a gate insulating film is formed by an amorphous carbon film, and has a thickness of approximately 20 nm. The protective film 50 is formed as a result of an aluminum oxide ($Al_2O_3$) film being formed by plasma atomic layer deposition (ALD).

The insulating film 30 includes a first amorphous carbon film 31 and a second amorphous carbon film 32 which are laminated, is an amorphous film of which carbon is the chief ingredient, and is also called diamond like carbon (DLC).

The first amorphous carbon film 31 is a first insulating film, to which nitrogen is added, and the ratio of the added nitrogen is 20 atm % or more. The second amorphous carbon film 32 is a second insulating film, to which nothing is added.

Since the first amorphous carbon film 31 is an amorphous carbon film to which nitrogen is added, the first amorphous carbon film 31 has a membrane stress lower than the second amorphous carbon film 32, and has higher adhesion with the cap layer 23.

The second amorphous carbon film 32 is an insulating film which has a high density and high insulting properties, and is a film having high surface smoothness. In order to obtain high insulating properties, a high density and so forth in an amorphous carbon film, it is preferable that hydrogen content in the amorphous carbon film is reduced as much as possible and the amorphous carbon film is like a diamond. Specifically, it is preferable that the film density is high, and the amorphous carbon film is in a state where $sp^3$ is greater than $sp^2$ in carbon-carbon bonds. Further, an amorphous carbon film having a state where $sp^3$ is greater than $sp^2$ in carbon-carbon bonds is a film having a higher density and a near diamond-like state. Therefore, in particular, it seems that a trap level is not easily formed, and the threshold voltage change range can be made to be approximately 0 V. That is, by forming the insulating film 30 by the amorphous carbon, it is possible to provide a semiconductor device which can carry out more stable switching operations and has higher reliability.

Describing in more detail, carbon-carbon bonds in carbon include, as bonding manners, $sp^2$ and $sp^3$. Graphite is formed by bonds of $sp^2$, and diamonds are formed by bonds of $sp^3$. Therefore, in order that an amorphous carbon film is more like a diamond, it is preferable that there are more $sp^3$ bonds than $sp^2$ bonds, and thus, it is preferable that carbon-carbon bonds are such as $sp^2 < sp^3$.

Figure 7:
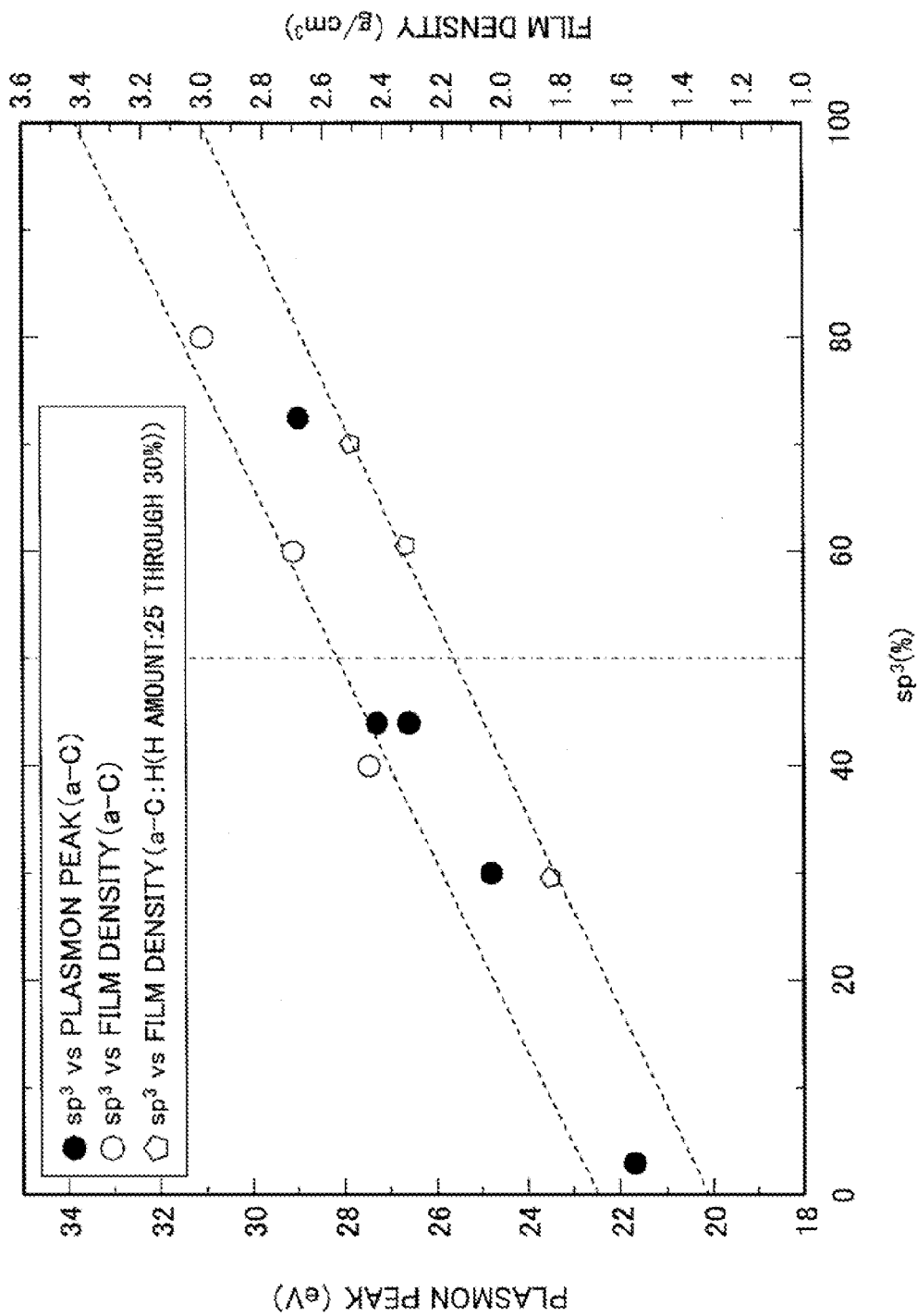
FIG. 7 depicts a correlation between a ratio of $sp^3$, a film density and a plasmon peak.

As depicted in FIG. 7, there is a correlation between the ratio of $sp^3$ of carbon-carbon bonds in an amorphous carbon film and the film density, and the higher the ratio of $sp^3$ of carbon-carbon bonds becomes, the higher the film density becomes. Further, there is a correlation between the ratio of $sp^3$ of carbon-carbon bonds in an amorphous carbon and the plasmon peak, and the higher the ratio of $sp^3$ of carbon-carbon bonds becomes, the higher the plasmon peak becomes. An amorphous carbon film, having the ratio of $sp^3$ of carbon-carbon bonds in the film of 50% or more (i.e., having $sp^3$ bonds more than $sp^2$ bonds and including little hydrogen) has the film density of 2.6 $g/cm^3$ or more, and has the plasmon peak of 28 eV or more. It is noted that the film density is calculated as a result of forming an amorphous carbon film on a silicon substrate, and based on a result obtained by Rutherford backscattering spectrometry and the film thickness obtained through section length measurement using a transmission electron microscope (TEM). It is noted that "a-C" depicted in FIG. 7 means "amorphous carbon", and "a-C:H" means "hydrogenated amorphous carbon".

It is noted that in the first embodiment, since nitrogen is added to the first amorphous carbon film 31, the first amorphous carbon film 31 has the film density lower than the second amorphous carbon film 32. Therefore, usually, the ratio of $sp^3$ in the first amorphous carbon film 31 is lower than the ratio of $sp^3$ in the second amorphous carbon film 32.

It is possible to form an amorphous carbon film having the film density of 2.6 $g/cm^3$ or more and having the plasmon peak of 28 eV or more by a FCA method which is an arc deposition method described later. Specifically, the film density of an amorphous carbon film formed by the FCA method is 3.2 $g/cm^3$. Further, the density of a diamond is 3.56 $g/cm^3$. Therefore, it is preferable that the second amorphous carbon film 32 has a density of equal to or greater than 2.6 $g/cm^3$ and equal to or less than 3.56 $g/cm^3$. Further, an amorphous carbon film formed by the FCA method has very low hydrogen content in comparison to an amorphous carbon film formed by chemical vapor deposition (CVD), and hydrogen content included in the amorphous carbon film formed by the FCA method is 1 atm % or less. It is noted that in an amorphous carbon film formed by CVD and including hydrogen, the film density at its highest is less than approximately 2.6 $g/cm^3$.

Further, the film thickness of an amorphous carbon film formed as the insulating film 30 is equal to or greater than 2 nm and equal to or less than 200 nm, and, in particular, is preferably equal to or greater than 10 nm. In order to cover the entire surface by the amorphous carbon film, it is preferable to provide a film thickness of at least several number of atomic layers or more, and therefore, it is not possible to cover the entire surface with a film thickness of less than 2 nm. In order to stably obtain the function as the gate insulating film, it is preferable to form the amorphous carbon film by equal to or greater than 10 nm.

Further, an interface between the first amorphous carbon film 31 and the second amorphous carbon film 32 of the insulating film 30 may have a so-called composition gradient in which the nitrogen concentration changes continuously. Furthermore, the entirety of the insulating film 30 may have a composition gradient in which the nitrogen concentration decreases gradually.

Further, the protective film 50 in the first embodiment is an insulating film, and is formed by an amorphous carbon film, an oxide film or a nitride film such as an aluminum oxide film, a silicon nitride film or such, or a film in which these films are laminated.

(Method of Manufacturing Semiconductor Device)

Next, based on FIGS. 8A, 8B, 8C, 9A and 9B, a method of manufacturing a semiconductor device according to the first embodiment will be described.

Figure 8A:
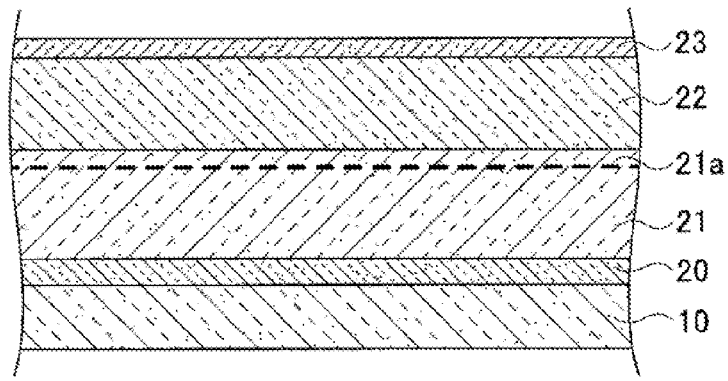
FIGS. 8A, 8B and 8C and FIGS. 9A and 9B depict manufacturing processes of the semiconductor device according to the first embodiment.

First, as depicted in FIG. 8A, the buffer layer 20 is formed on the substrate 10, and on the buffer layer 20, the semiconductor layers such as the electron transit layer 21, the electron supply layer 22 and the cap layer 23 are formed through epitaxial growth using metal-organic vapor phase epitaxy (MOVPE) or such. As for the substrate 10, a substrate made of Si, SiC, sapphire ($Al_2O_3$) or such may be used, and the buffer layer 20 is formed on the substrate 10 for the purpose that the electron transit layer 21 and so forth are formed through epitaxial growth. The buffer layer 20 is formed by, for example, nondoped i-AlN having a thickness of approximately 0.1 μm. The electron transit layer 21 is formed by nondoped i-GaN having a thickness of approximately 3 μm. The electron supply layer 22 is formed by n-$Al_{0.25}Ga_{0.75}N$ having a thickness of approximately 30 nm, and is doped by, as an impurity element, Si, by a concentration of $5 \times 10^{18}$ cm$^{-3}$. The cap layer 23 is formed by n-GaN having a thickness of approximately 10 nm, and is doped by, as an impurity element, Si, by a concentration of 5×10$^{18}$ cm$^{-3}$. It is noted that the semiconductor layers may be formed as a result of semiconductor layers being formed by crystal growth using molecular beam epitaxy (MBE) other than MOVPE.

Figure 8B:
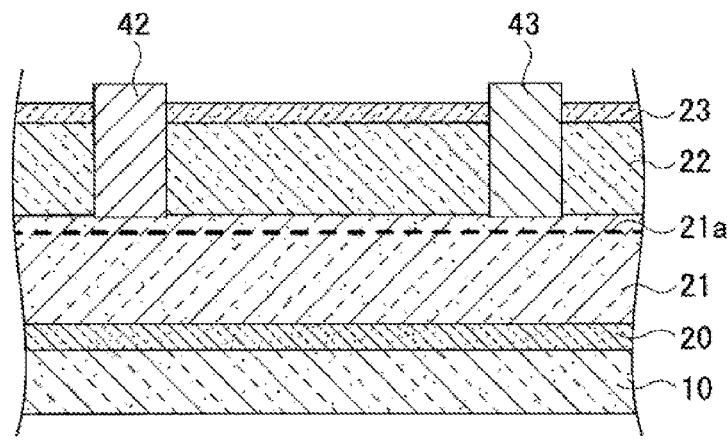

Next, as depicted in FIG. 8B, the source electrode 42 and the drain electrode 43 are formed. Specifically, photoresist is coated on the cap layer 23, and exposure by an exposure apparatus and development are carried out. Thereby, a resist pattern (not depicted) is formed having openings at areas at which the source electrode 42 and the drain electrode 43 will be formed. After that, dry etching is carried out by reactive ion etching (RIE) or such using a chlorine gas. Thereby, the cap layer 23 and the electron supply layer 22 are removed from the areas at which the resist pattern is not formed, and thus the surface of the electron transit layer 21 is exposed at these areas. The dry etching carried out at this time is carried out in such a manner that a chlorine gas (as an etching gas) is introduced at approximately 30 sccm into a chamber, the pressure inside of the chamber is set at approximately 2 Pa, and RF power is applied by 20 W. After that, a metal film made of a laminated film of Ta/Al or such is formed by vacuum evaporation or such. After that, dipping into an organic solvent or such is carried out, and thereby the metal film formed on the resist pattern is removed together with the resist pattern through a lift-off method. Thereby, it is possible to form the source electrode 42 and the drain electrode 43 at the areas at which the resist pattern is not formed. Further, after the lift-off method is carried out, it is possible to provide ohmic contacts by carrying out heat treatment at a temperature of 550° C. It is noted that in the above description, the case where the resist pattern is used for carrying out dry etching is also used for carrying out the lift-off method has been described. However, respective resist patterns may be formed for the two purposes, separately.

Figure 8C:
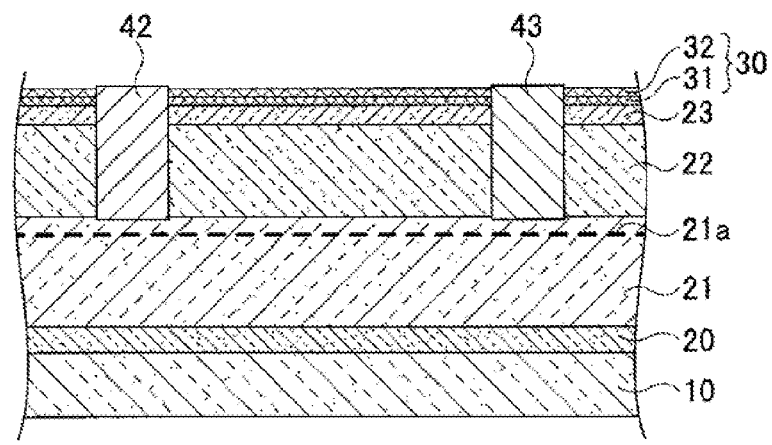

Next, as depicted in FIG. 8C, the insulating film 30 to be the gate insulating layer is formed on the cap layer 23. The insulating film 30 includes the first amorphous carbon film 31 and the second amorphous carbon film 32, as mentioned above, and both of which are formed by the FCA method. The first amorphous carbon film 31 is an amorphous carbon film to which nitrogen is added. The first amorphous carbon film 31 is formed to have a film thickness of approximately 5 nm in a condition where, nitrogen is introduced at 25 sccm, a graphite target is used as a raw material, an arc electric current is 70 A, and an arc voltage is 26 V. The second amorphous carbon film 32 is an amorphous carbon film to which nitrogen or the like is not added. The second amorphous carbon film 32 is formed to have a film thickness of approximately 15 nm in a condition where a graphite target is used as a raw material, an arc electric current is 70 A, and an arc voltage is 26 V. In the above description, the case where the first amorphous carbon film 31 is formed by the FCA method has been described. However, the first amorphous carbon film 31 may be an amorphous carbon film formed by, for example, sputtering, CVD or such.

Figure 9A:
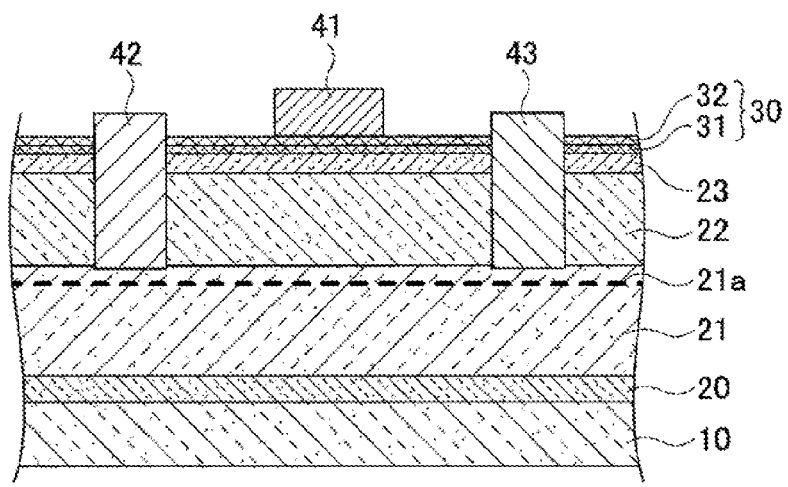

Next, as depicted in FIG. 9A, the gate electrode 41 is formed. Specifically, on the insulating film 30, photoresist is coated, and exposure by an exposure apparatus and development are carried out. Thereby, a resist pattern (not depicted) is formed having an opening at an area at which the gate electrode 41 will be formed. After that, a metal film (Ni: film thickness of approximately 10 nm/Au: film thickness of approximately 300 nm) is formed on the entire surface by vacuum evaporation. After that, dipping into an organic solvent or such is carried out, and thereby the metal film formed on the resist pattern is removed together with the resist pattern through the lift-off method. Thereby, the gate electrode 41 made of a laminated film of Ni/Au is formed at the predetermined area.

Figure 9B:
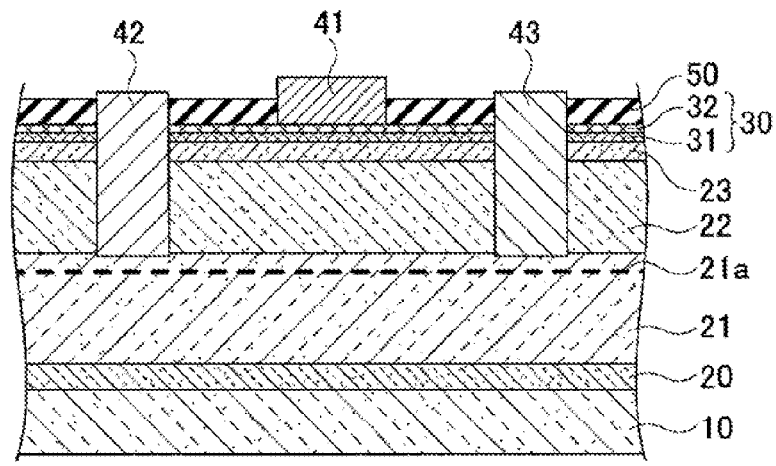

Next, as depicted in FIG. 9B, the protective film 50 is formed on the insulating film 30. As the protective film 50, for example, an aluminum oxide film formed by the ALD method, an amorphous carbon film formed by the FCA method, a silicon nitride film formed by a plasma CVD method, or such, may be used. Further, a film in which these films are laminated may also be used instead.

Thus, it is possible to manufacture the transistor which is the semiconductor device according to the first embodiment. In the above description, the semiconductor device in which the semiconductor layers are formed by GaN and AlGaN has been described. However, the first embodiment may also be applied to semiconductor devices using nitride semiconductors such as InAlN, InGaAlN and so forth as the semiconductor layers in the same way.

(Forming of Amorphous Carbon Film)

Figure 10:
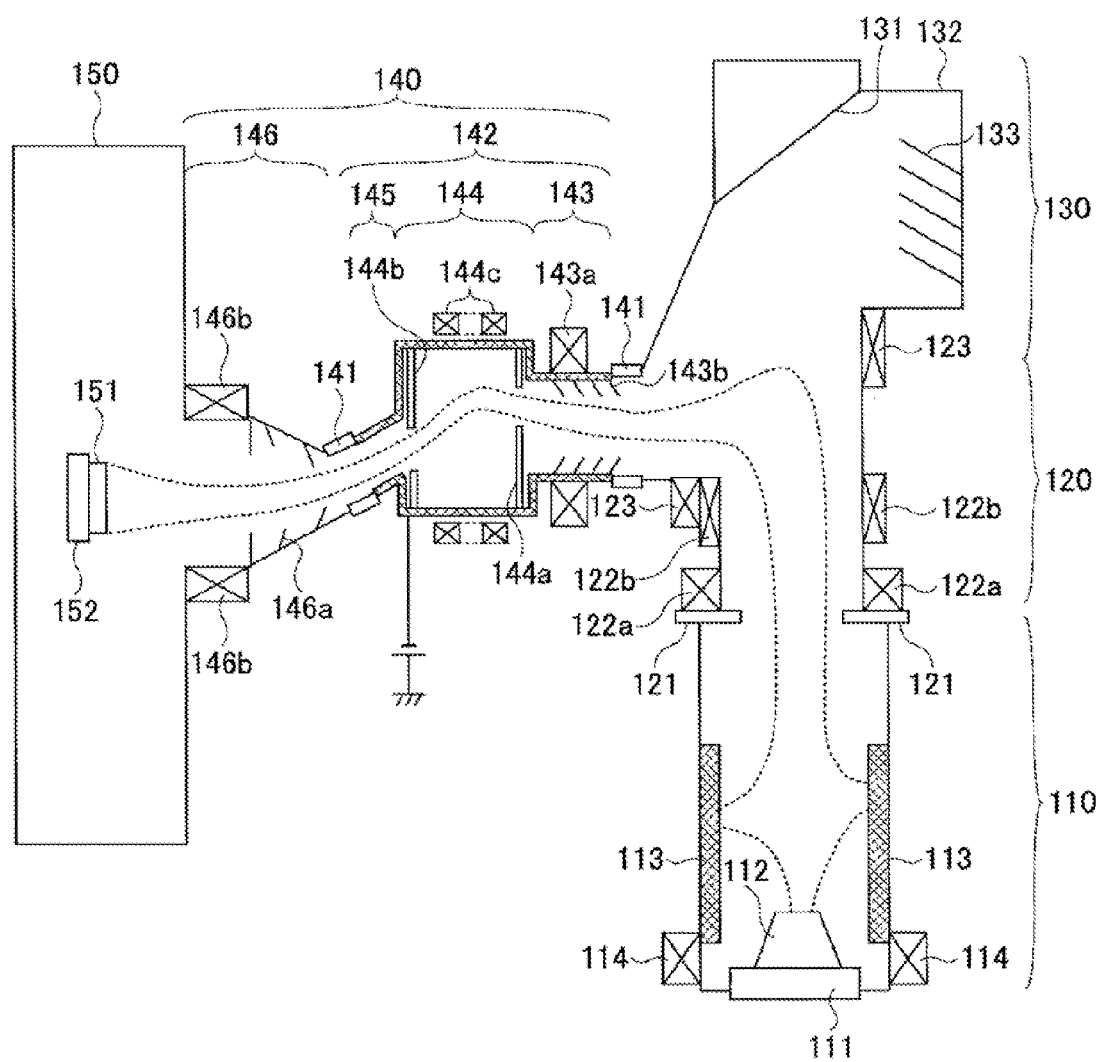
FIG. 10 depicts a structure of a filtered cathodic arc (FCA) film forming apparatus.

Next, the FCA method for forming amorphous carbon films will be described. FIG. 10 depicts a structure of a FCA film forming apparatus used for the FCA method. The FCA film forming apparatus includes a plasma generation part 110, a plasma separation part 120, a particle trap part 130, a plasma transfer part 140, and a film forming chamber 150. The plasma generation part 110, plasma separation part 120 and particle trap part 130 are formed to have cylindrical shapes, respectively, and are connected together in the stated order. The plasma transfer part 140 is also formed to have a cylindrical shape, one end thereof is connected with the plasma separation part 120 approximately perpendicularly, and the other end thereof is connected with the film forming chamber 150. In the inside of the film forming chamber 150, a stage 152 for placing a substrate 151 on which film forming is carried out is provided.

An insulating plate 111 is provided at a bottom end part of a housing of the plasma generation part 110, and graphite used as a target (cathode) 112 is provided on the insulating plate 111. Further, a cathode coil 114 is provided on an outer circumferential surface of the housing of the plasma generation part 110, and an anode 113 is provided on an inner wall surface of the housing. When an amorphous carbon film is formed, a certain voltage is applied between the target 112 and the anode 113 by a power source (not depicted), arc discharge is caused to occur, and plasma is generated above the target 112. At this time, to the cathode coil 114, a certain electric current is supplied from another power source (not depicted), and a magnetic field for stabilizing the arc discharge is generated. By the arc discharge, carbon included in the target 112 of the graphite is evaporated, and is supplied to the plasma as ions of the film forming material.

An insulating ring 121 is provided at a boundary part between the plasma generation part 110 and the plasma separation part 120, and by the insulating ring 121, the housing of the plasma generation part 110 and a housing of the plasma separation part 120 are electrically separated. On an outer circumferential surface of the housing of the plasma separation part 120, guide coils 122a and 122b are provided for generating a magnetic field used to move the plasma generated by the plasma generation part 110 in a predetermined direction while converging the plasma at a central part of the housing. Further, an oblique magnetic field generation coil 123 for generating a magnetic field to turn the moving direction of the plasma approximately perpendicularly is provided near a part at which the plasma separation part 120 and the plasma transfer part 130 are connected.

Particles generated in the plasma generation part 110 go straight into the particle trap part 130, almost without being affected by the magnetic field in the plasma separation part 120. At a top end part of the particle trap part 130, a reflection plate 131 reflecting the particles laterally and a particle capture part 132 capturing the particles reflected by the reflection plate 131 are provided. In the particle capture part 132, plural fins 133 are disposed obliquely with respect to the inside of the housing. The particles going into the particle capture part 132 are reflected by the fins repeatedly, losing kinetic energy, finally adhering to the plural fins 133, the wall surfaces of the housing of the particle capture part 132 or such, and are captured.

The plasma separated from the particles in the plasma separation part 120 goes into the plasma transfer part 140. The plasma transfer part 140 is divided into a negative voltage application part 142 and a communication part 146. Insulating rings 141 are provided between the negative voltage application part 142 and the plasma separation part 120 and between the negative voltage application part 142 and the communication part 146. Thereby, the negative voltage application part 142 and the plasma separation part 120 are electrically separated and the negative voltage application part 142 and the communication part 146 are electrically separated.

The negative voltage application part 142 is further divided into an inlet part 143 near the plasma separation part 120, an outlet part 145 near the communication part 146, and an intermediate part 144 between the inlet part 143 and the outlet part 145. A coil 143a for generating a magnetic field for moving the plasma toward the film forming chamber 150 while converging the plasma is provided on the outer circumferential surface of the inlet part 143. Further, plural fins 143b for capturing the particles going into the inlet part 143 are provided obliquely with respect to the inner wall surface of the housing in the inside of the inlet part 143.

Apertures 144a and 144b having openings defining a flow passage of the plasma are provided near the inlet part 143 and near the outlet part 145 in the intermediate part 144. Further, on the outer circumferential surface of the intermediate part 144, a guide coil 144c generating a magnetic field for turning the moving direction of the plasma is provided.

The communication part 146 is formed to become gradually wider from the side near the negative voltage application part 142 to the side near the film forming chamber 150. Also in the inside of the communication part 146, plural fins 146a are provided, and on an outer circumferential surface of a boundary part between the communication part 146 and the film forming chamber 150, a guide coil 146b for generating a magnetic field to move the plasma to the side near the film forming chamber 150 while converging the plasma is provided.

In the FCA film forming apparatus, arc discharge is carried out in the plasma generation part 110, thereby the plasma including carbon ions is generated, the plasma is caused to reach the substrate 151 and so forth while components as the particles are removed by the oblique magnetic field generation coil 123 and so forth. Thereby, the amorphous carbon film can be formed on the substrate 151 and so forth.

Second Embodiment

Next, a second embodiment will be described. In the second embodiment, the protective film in the semiconductor device according to the first embodiment is formed by a film including a first amorphous carbon film and a second amorphous carbon film.

Figure 11:
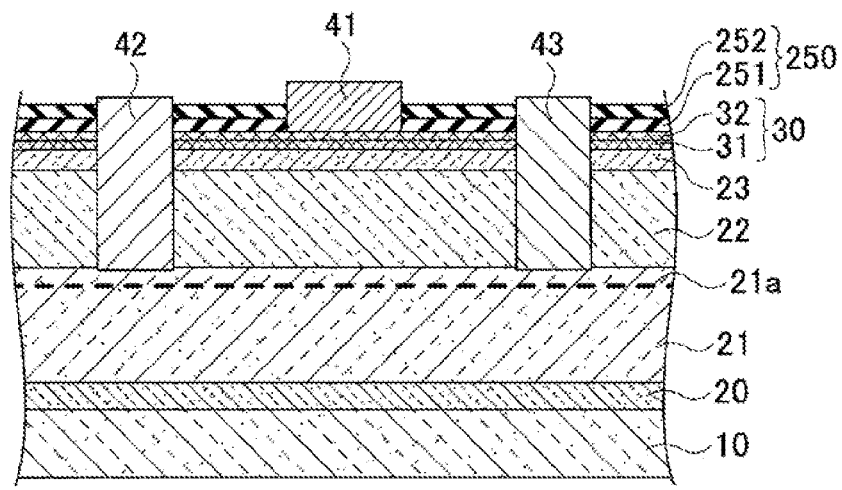
FIG. 11 depicts a structure of a semiconductor device according to a second embodiment.

Based on FIG. 11, a semiconductor device according to the second embodiment will be described. In the semiconductor device according to the second embodiment, a protective film 250 is provided on the insulating film 30, and the protective film 250 includes the first amorphous carbon film 251 and the second amorphous carbon film 252, both of which are formed by the FCA method.

The first amorphous carbon film 251 is a first protective film, and is an amorphous carbon film to which nitrogen is added. The second amorphous carbon film 252 is a second protective film, and an amorphous carbon film to which nitrogen or the like is not added. The second amorphous carbon film 252 is formed on the first amorphous carbon film 251.

The first amorphous carbon film 251 is formed to have a film thickness of approximately 5 nm in a condition where, nitrogen is introduced at 25 sccm, a graphite target is used as a raw material, an arc electric current is 70 A, and an arc voltage is 26 V. The second amorphous carbon film 252 is formed to have a predetermined film thickness in a condition where a graphite target is used as a raw material, an arc electric current is 70 A, and an arc voltage is 26 V.

In the above description, the case where the first amorphous carbon film 251 is formed by the FCA method has been described. However, the first amorphous carbon film may be an amorphous carbon film formed by, for example, sputtering, CVD, or such. Further, the first amorphous carbon film 251 may be a film in which an aluminum oxide film formed by the ALD method, a silicon nitride film formed by the plasma CVD method, or the like, is further formed on a film in which the first amorphous carbon film 251 and the second amorphous carbon film 252 are laminated.

It is noted that the contents other than those described above in the second embodiment are the same as those of the first embodiment. Further, the second embodiment may also be applied to a case where the insulating film to be the gate insulating film is formed by a film other than the amorphous carbon film, and thus, for example, the insulating film is formed by oxide such as aluminum oxide, nitride or such.

Third Embodiment

Next, a third embodiment will be described. In a semiconductor device according to the third embodiment, an insulating film to be a gate insulating film is formed by an amorphous carbon film to which nitrogen is added.

Figure 12:
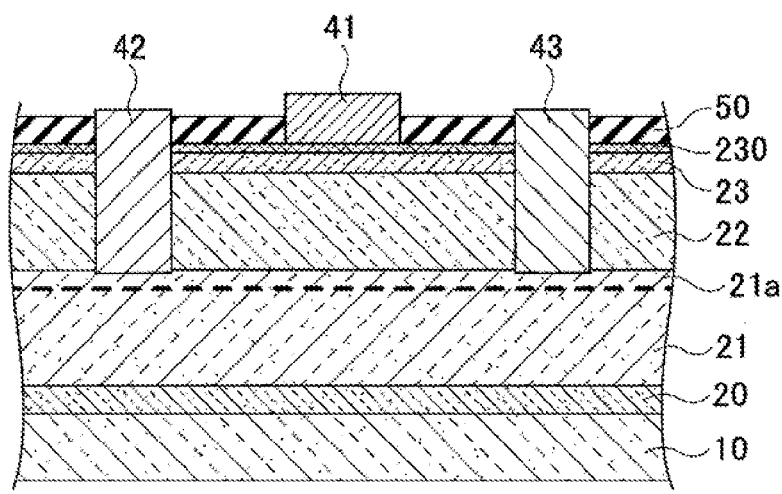
FIG. 12 depicts a structure of a semiconductor device according to a third embodiment.

Based on FIG. 12, the semiconductor device according to the third embodiment will be described. In the semiconductor device according to the third embodiment, the insulating film to be the gate insulating film is formed by an insulating film 230 made of the amorphous carbon film to which nitrogen is added.

The insulating film 230 is similar to the first amorphous carbon film 31 in the first embodiment, is formed by the FCA method in a condition where, nitrogen is introduced at 25 sccm, a graphite target is used as a raw material, an arc electric current is 70 A, and an arc voltage is 26 V. It is noted that the insulating film 230 is formed to have the film thickness of approximately 20 nm.

Since the amorphous carbon film to which nitrogen is added has a low membrane stress, the film density is reduced. However, peeling of the film does not easily occur. Therefore, in a case where the reduction in film density is not much problematic, the entirety of the gate insulating film may be formed by the amorphous carbon film to which nitrogen is added.

It is noted that the insulating film 230 may be a film having a composition gradient in which in the film thickness direction of the insulating film 230, the nitrogen concentration is reduced. Such a film may be formed by gradually reducing the introduced amount of nitrogen.

Further, for the third embodiment, the insulating film 230, to be the gate insulating film, formed by the amorphous carbon film to which nitrogen is added, has been described. Furthermore, the entirety of the insulating film to be the protective film 50 may be formed by an amorphous carbon film to which nitrogen is added. As the insulating film 230 or the protective film 50, an amorphous carbon film to which oxygen, hydrogen, fluorine or such is added may also be used. However, by the above-described reason, as the insulating film 230 or such, an amorphous carbon film to which nitrogen is added is preferable.

Further, although the case where the amorphous carbon film to be the insulating film 230 or such is formed by the FCA method has been described, a similar amorphous carbon film formed by, for example, sputtering, CVD or such, may be used, instead.

It is noted that the contents other than those described above are the same as those of the first embodiment, and the third embodiment may be used also in the semiconductor device according to the second embodiment.

Fourth Embodiment

A fourth embodiment will now be described.
(Structure of Semiconductor Device)

Figure 13:
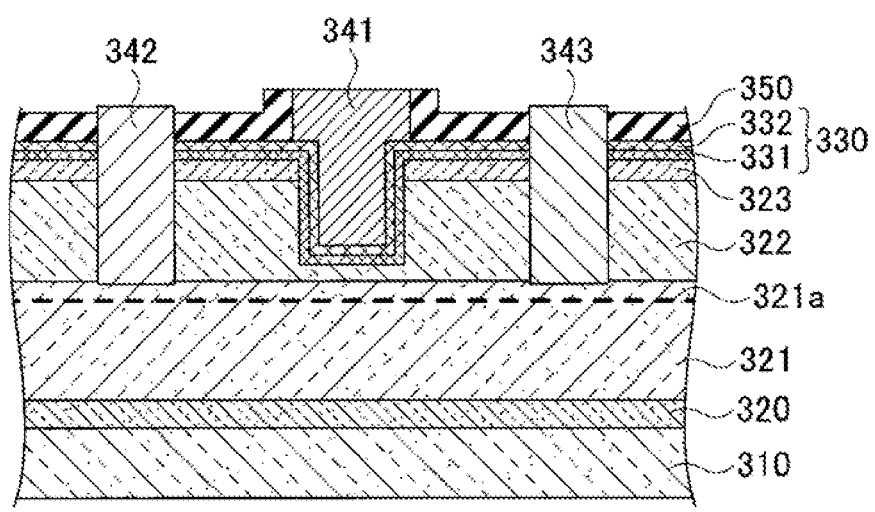
FIG. 13 depicts a structure of a semiconductor device according to a fourth embodiment.

Based on FIG. 13, a semiconductor device according to the fourth embodiment will be described. The semiconductor device according to the fourth embodiment is a HEMT, and a buffer layer 320 is formed on a substrate 310 made of a semiconductor or such, and on the buffer layer 320, an electron transit layer 321, an electron supply layer 322 and a cap layer 323 are formed through epitaxial growth as being laminated. Further, a source electrode 342 and a drain electrode 343 are formed to be connected with the electron transit layer 321. A gate electrode 341 is formed in an opening, which is formed as a result of parts of the cap layer 323 and the electron supply layer 322 being removed, through an insulating layer 330. It is noted that the insulating film 330 is formed also on the cap layer 323, and a protective film 350 made of an insulator is formed on the insulating film 330.

As the substrate 310, a Si substrate, a SiC substrate, a sapphire ($Al_2O_3$) substrate or such is used. In the fourth embodiment, a Si substrate is used as the substrate 310, and therefore, the buffer layer 320 is formed. However, in a case where the substrate 310 made of another material is used, there may be a case where it is not necessary to form the buffer layer 320. The electron transit layer 321 as a first semiconductor layer is formed by i-GaN, the electron supply layer 322 as a second semiconductor layer is formed by n-AlGaN, and the cap layer 323 as a third semiconductor layer is formed by n-GaN. As a result, a 2-dimensional electron gas (2DEG) 321a is formed in the electron transit layer 321 at a side near the electron supply layer 322. Further, between the electron transit layer 321 and the electron supply layer 322, a spacer layer (not depicted) may be formed. The gate electrode 341, source electrode 342 and drain electrode 343 are formed by metal materials.

The insulating layer 330 to be a gate insulating film includes a first amorphous carbon film 331 and a second amorphous carbon film 332 which are laminated, is an amorphous film of which carbon is the chief ingredient, and is also called DLC. The first amorphous carbon film 331 is an amorphous carbon film to which nitrogen is added, and the ratio of the added nitrogen is 20 atm % or more. The second amorphous carbon film 332 is an amorphous carbon film to which nothing is added. Since the first amorphous carbon film 331 is an amorphous carbon film to which nitrogen is added, the first amorphous carbon film 331 has a membrane stress lower than the second amorphous carbon film 332, and has high adhesion with the cap layer 323. According to the fourth embodiment, the first amorphous carbon film 331 is formed by a thickness of approximately 5 nm, and the second amorphous carbon film 332 is formed by a thickness of approximately 15 nm. The protective film 350 is formed as a result of an aluminum oxide ($Al_2O_3$) film being formed by the plasma ALD.
(Method of Manufacturing Semiconductor Device)

Next, based on FIGS. 14A, 14B, 14C, 15A, 15B and 15C, a method of manufacturing a semiconductor device according to the fourth embodiment will be described.

Figure 14A:
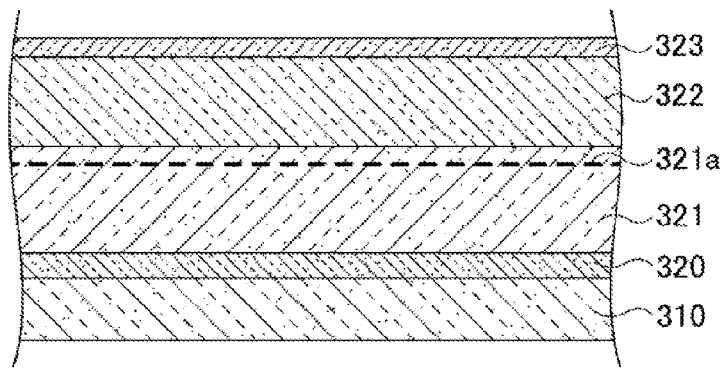
FIGS. 14A, 14B and 14C and FIGS. 15A, 15B and 15C depict manufacturing processes of the semiconductor device according to the fourth embodiment.

First, as depicted in FIG. 14A, the buffer layer 320 is formed on the substrate 310, and on the buffer layer 320, the semiconductor layers such as the electron transit layer 321, the electron supply layer 322 and the cap layer 323 are formed through epitaxial growth by MOVPE or such. As for the substrate 310, a substrate made of Si, SiC, sapphire ($Al_2O_3$) or such may be used, and the buffer layer 320 is formed on the substrate 310 for the purpose that the electron transit layer 321 and so forth are formed through epitaxial growth. The buffer layer 320 is formed by, for example, nondoped i-AlN having a thickness of approximately 0.1 μm. The electron transit layer 321 is formed by nondoped i-GaN having a thickness of approximately 3 μm. The electron supply layer 322 is formed by n-$Al_{0.25}Ga_{0.75}N$ having a thickness of approximately 30 nm, and is doped by, as an impurity element, Si, by a concentration of $5 \times 10^{18}$ cm$^{-3}$. The cap layer 323 is formed by n-GaN having a thickness of approximately 10 nm, and is doped by, as an impurity element, Si, by a concentration of $5 \times 10^{18}$ cm$^{-3}$.

Figure 14B:
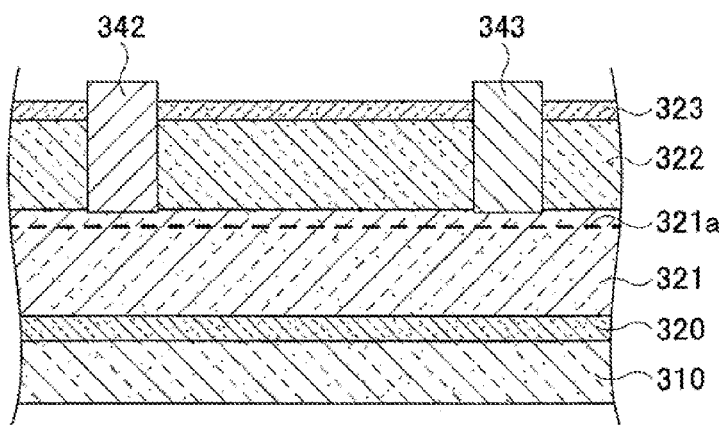

Next, as depicted in FIG. 14B, the source electrode 342 and the drain electrode 343 are formed. Specifically, photoresist is coated on the cap layer 323, and exposure by an exposure apparatus and development are carried out. Thereby, a resist pattern (not depicted) having openings at areas at which the source electrode 342 and the drain electrode 343 will be formed is formed. After that, dry etching is carried out by reactive ion etching (RIE) or such using a chlorine gas. Thereby, the cap layer 323 and the electron supply layer 322 are removed at the areas at which the resist pattern is not formed, and thus the surface of the electron transit layer 321 is exposed at the areas. After that, a metal film made of a laminated film of Ta/Al or such is formed by vacuum evaporation or such. After that, dipping into an organic solvent or such is carried out, and thereby the metal film formed on the resist pattern is removed together with the resist pattern through a lift-off method. Thereby, it is possible to form the source electrode 342 and the drain electrode 343 at the areas at which the resist pattern is not formed. Further, after the lift-off method is carried out, it is possible to provide ohmic contacts by carrying out heat treatment at a temperature of 550° C., for example.

Figure 14C:
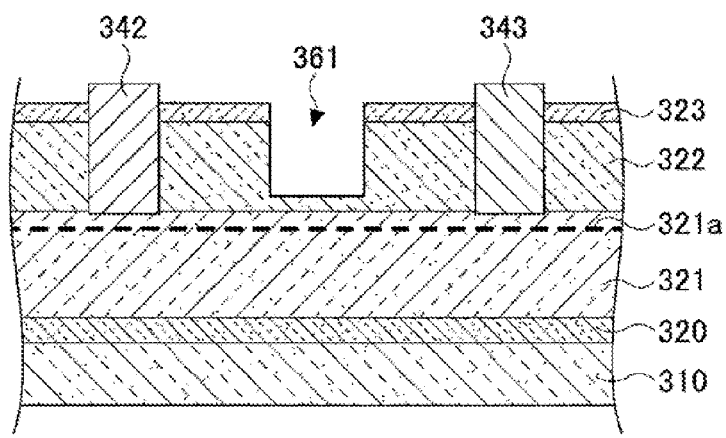

Next, as depicted in FIG. 14C, an opening 361 is formed. Specifically, photoresist is coated on the cap layer 323, and exposure by an exposure apparatus and development are carried out. Thereby, a resist pattern (not depicted) is formed having an opening at an area at which the opening 361 will be formed. After that, dry etching is carried out by reactive ion etching (RIE) or such using a gas including chlorine, using the resist pattern as a mask. Thereby, parts of the cap layer 323 and the electron supply layer 322 are removed at the area at which the resist pattern is not formed, and thus the opening 361 is formed. After that, the resist pattern is removed.

Figure 15A:
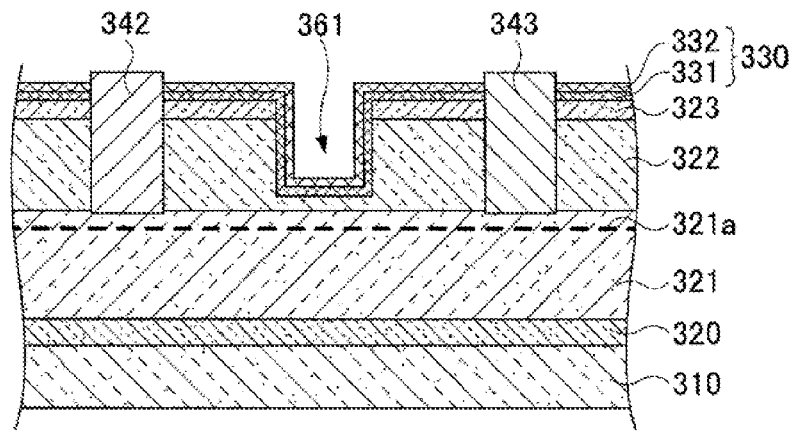

Next, as depicted in FIG. 15A, the insulating film 330 is formed on the cap layer 323 in the inside of the opening 361. The insulating film 330 includes the first amorphous carbon film 331 and the second amorphous carbon film 332, and both of which are formed by the FCA method. The first amorphous carbon film 331 is an amorphous carbon film to which nitrogen is added. The first amorphous carbon film 331 is formed to have a film thickness of approximately 5 nm in a condition where, nitrogen is introduced at 25 sccm, a graphite target is used as a raw material, an arc electric current is 70 A, and an arc voltage is 26 V. The second amorphous carbon film 332 is an amorphous carbon film to which nitrogen or the like is not added. The second amorphous carbon film 332 is formed to have a film thickness of approximately 15 nm in a condition where a graphite target is used as a raw material, an arc electric current is 70 A, and an arc voltage is 26 V. In the above description, the case where the first amorphous carbon film 331 is formed by the FCA method has been described. However, the first amorphous carbon film 331 may be an amorphous carbon film formed by, for example, sputtering, CVD or such.

Figure 15B:
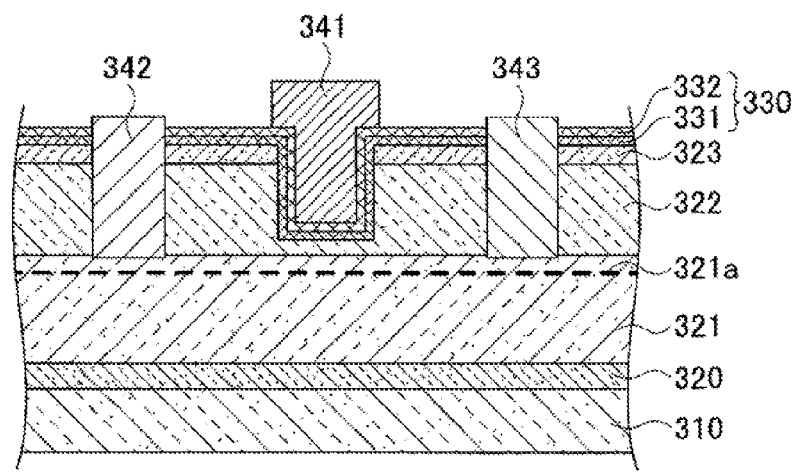

Next, as depicted in FIG. 15B, the gate electrode 341 is formed. Specifically, on the insulating film 330, a lower layer resist (not depicted) (for example, trade name: PMGI, manufactured by United States, MicroChem Corp.) and an upper layer resist (not depicted) (for example, trade name: PFI32-A8, manufactured by Sumitomo Chemical Company, Limited) are formed as a result of being coated by a spin coat method or such. After that, through exposure by an exposure apparatus and development, an opening having a diameter of approximately the order of 0.8 μm is formed on the upper resist at an area including the part at which the opening 361 is formed. Next, using the upper layer resist as a mask, wet etching is carried out on the lower layer resist using an alkaline developer. After that, a metal film (Ni: film thickness of approximately 10 nm/Au: film thickness of approximately 300 nm) is formed on the entire surface by vacuum evaporation. After that, the lift-off method is carried out using a heated organic solvent, and thereby, together with the upper layer resist and lower layer resist, the metal layer formed on the upper layer resist is removed. Thereby, the gate electrode 341 made of a laminated film of Ni/Au is formed in the opening 361 through the insulating film 330.

Figure 15C:
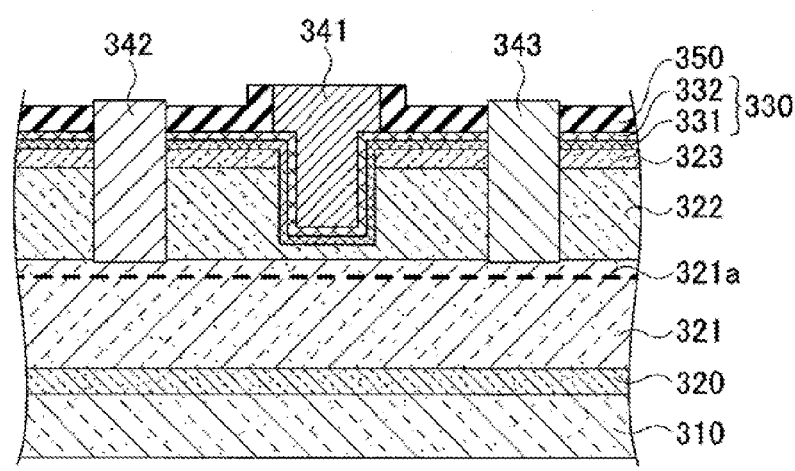

Next, as depicted in FIG. 15C, the protective film 350 is formed on the insulating film 330. As the protective film 350, for example, an aluminum oxide film formed by the ALD method, an amorphous carbon film formed by the FCA method, a silicon nitride film formed by the plasma CVD method, or such, may be used. Further, a film in which these films are laminated may also be used instead.

Thus, it is possible to manufacture the transistor which is the semiconductor device according to the fourth embodiment.

The contents other than those described above are the same as those of the first embodiment. In the fourth embodiment, the protective film in the second embodiment and the insulating film to be the gate insulating film in the third embodiment may be used in the same way.

Fifth Embodiment

Next, a fifth embodiment will be described. The fifth embodiment includes a semiconductor device, a power-supply unit and a high-frequency amplifier.

Figure 16:
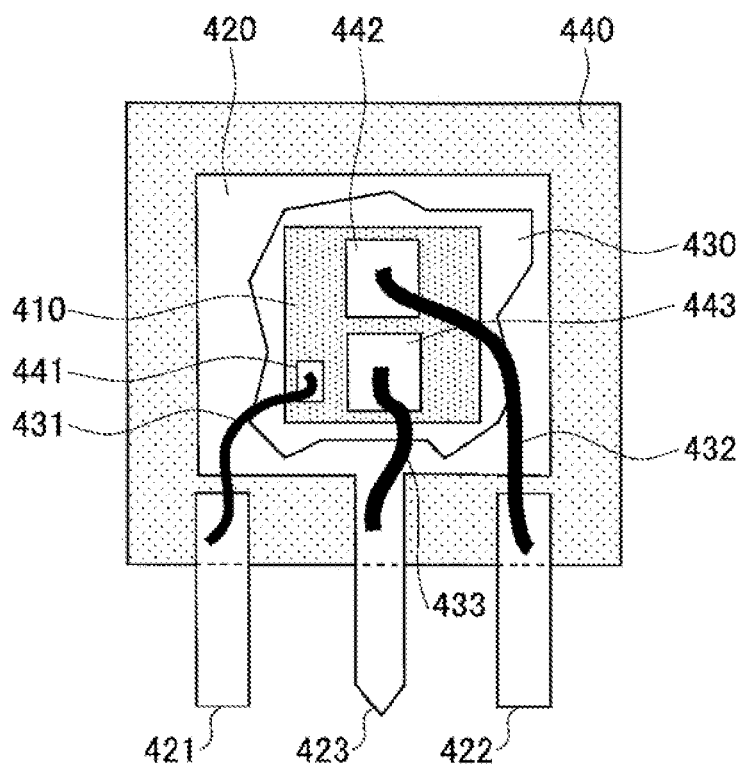
FIG. 16 illustrates a semiconductor device packaged in a discrete package manner according to a fifth embodiment.

The semiconductor device according to the fifth embodiment is one obtained from packaging the semiconductor device according to any one of the first through fourth embodiments in a discrete package manner. The semiconductor device which is thus packaged in the discrete package manner will be described based on FIG. 16. FIG. 16 schematically depicts the inside of the semiconductor device which is packaged in the discrete package manner, and the arrangement of the electrodes and so forth are different from those of the first through fourth embodiments.

First, the semiconductor device manufactured according to any one of the first through fourth embodiments is cut by dicing or such, and a semiconductor chip 410 of HEMT of GaN-based semiconductor material(s) is formed. Then, the semiconductor chip 410 is fixed onto a lead frame 420 by a die attach material 430 such as a solder.

Next, a gate electrode 441 is connected with a gate lead 421 using a bonding wire 431, a source electrode 442 is connected with a source lead 422 using a bonding wire 432, and a drain electrode 443 is connected with a drain lead 423 using a bonding wire 433. The bonding wires 431, 432 and 433 are formed by metal materials such as Al or such. It is noted that the gate electrode 441 according to the fifth embodiment is a gate electrode pad, and is connected with the gate electrode 41 or the gate electrode 341 according to the corresponding one of the first through fourth embodiments. Similarly, the source electrode 442 is a source electrode pad, and is connected with the source electrode 42 or the source electrode 342. The drain electrode 443 is a drain electrode pad, and is connected with the drain electrode 43 or the drain electrode 343.

Next, according to a transfer mold technique, plastic molding (or plastic seal) is carried out using a mold resin 440. Thus, it is possible to manufacture the semiconductor device packaged in the discrete package manner of HEMT using the GaN-based semiconductor material(s).

Further, the power-supply unit and the high-frequency amplifier according to the fifth embodiment are a power-supply unit and a high-frequency amplifier using any one of the semiconductor devices according to the first through fourth embodiments.

Figure 17:
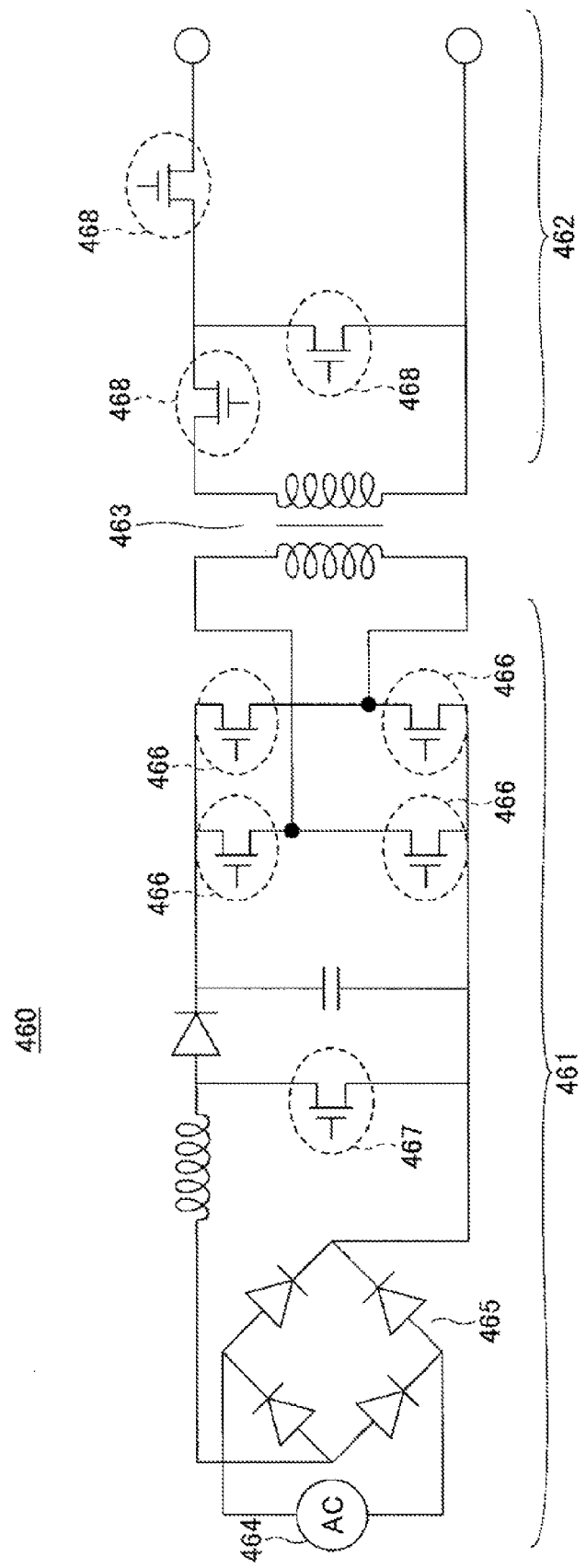
FIG. 17 depicts a circuit diagram of a power-supply unit according to the fifth embodiment.

Based on FIG. 17, the power-supply unit according to the fifth embodiment will be described. The power-supply unit 460 according to the fifth embodiment includes a (high-voltage) primary circuit 461, a (low-voltage) secondary circuit 462, and a transformer 463 disposed between the primary circuit 461 and the secondary circuit 462. The primary circuit 461 includes an alternate-current power source 464, a so-called bridge rectifying circuit 465, plural (four in the example of FIG. 17) switching devices 466 and a switching device 467. The secondary circuit 462 includes plural (three in the example of FIG. 17) switching devices 468. In the example depicted in FIG. 17, the semiconductor devices according to any one of the first through fourth embodiments are used as the switching devices 466 and 467 in the primary circuit 461. It is noted that the switching devices 466 and 467 in the primary circuit 461 may be preferably normally-off semiconductor devices. Further, as the plural switching devices 468 used in the secondary circuit 462, ordinary metal insulator semiconductor field effect transistors (MISFET) formed by silicon are used.

Figure 18:
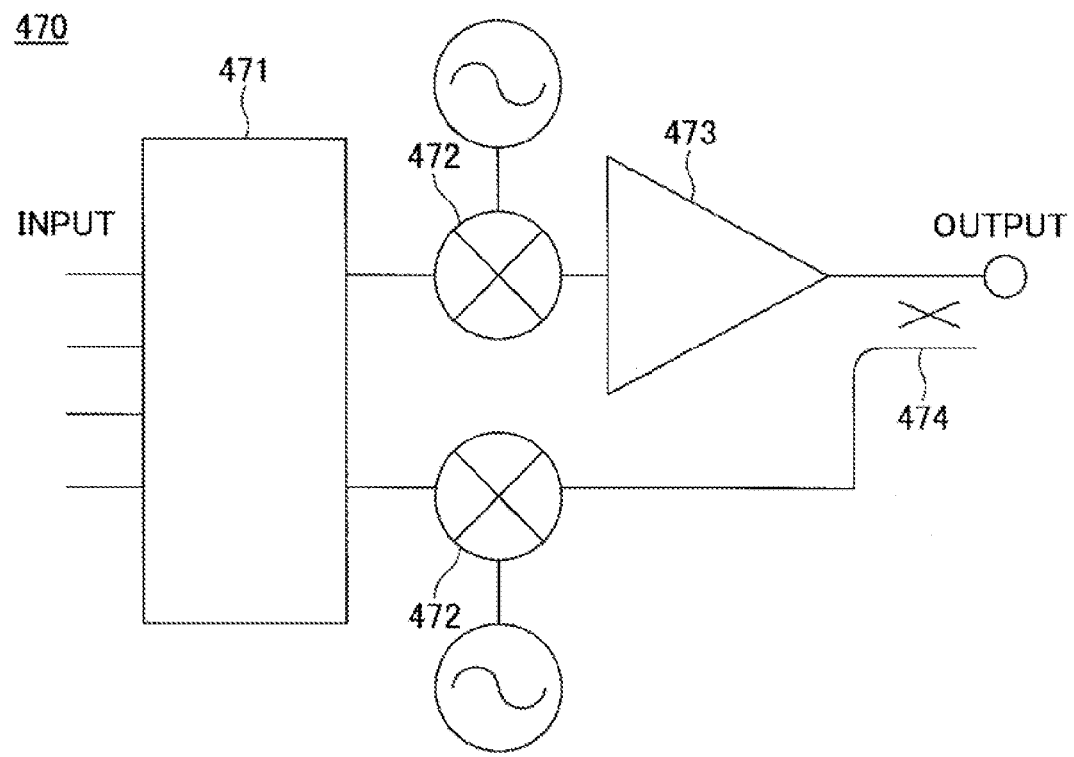
FIG. 18 depicts a structure of a high power amplifier according to the fifth embodiment.

Further, based on FIG. 18, the high-frequency amplifier according to the fifth embodiment will now be described. The high-frequency amplifier 470 according to the fifth embodiment may be applied as a power amplifier for a base station for cellular phones, for example. The high-frequency amplifier 470 includes a digital pre-distortion circuit 471, a mixer 472, a power amplifier 473 and a directional coupler 474. The digital pre-distortion circuit 471 compensates non-linear distortion of an input signal. The mixer 472 mixes an input signal for which non-linear distortion is compensated and an alternate-current signal. The power amplifier 473 has semiconductor(s) according to any one of the first through fourth embodiments. The directional coupler 474 monitors the input signal and/or the output signal. In the circuit depicted in FIG. 18, for example, by switching switches (not depicted), it is possible that the mixer 472 mixes the output signal and the alternate-current signal, and the resulting signal is sent to the digital pre-distribution circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A semiconductor device, comprising:
    a semiconductor layer formed above a substrate;
    an insulating film formed on the semiconductor layer; and
    an electrode formed on the insulating film,
    wherein the electrode is a gate electrode,
    wherein the semiconductor layer includes a first semiconductor layer and a second semiconductor layer formed above the first semiconductor layer,
    wherein the insulating film includes a first insulating film and a second insulating film formed on the first insulating film,
    wherein a concentration of any one of nitrogen, oxygen, hydrogen and fluorine included in the first insulating film is higher than the concentration included in the second insulating film to cause the first insulating film to have a lower membrane stress than the second insulating film,
    wherein the first insulating film having a higher concentration of any one of nitrogen, oxygen, hydrogen, and fluorine than the second insulating film directly contacts the semiconductor layer,
    wherein the semiconductor device has a source electrode and a drain electrode formed in contact with the first semiconductor layer or the second semiconductor layer, and
    wherein the insulating film is formed by an amorphous film, wherein carbon is a chief ingredient of the amorphous film.

2. The semiconductor device as claimed in claim 1, wherein the first semiconductor layer includes GaN, and the second semiconductor layer includes AlGaN.

3. A semiconductor device, comprising:
    a semiconductor layer formed above a substrate;
    an insulating film formed on the semiconductor layer; and
    an electrode formed on the insulating film,
    wherein the electrode is a gate electrode,
    wherein the semiconductor layer includes a first semiconductor layer and a second semiconductor layer formed above the first semiconductor layer,
    wherein the insulating film includes a first insulating film and a second insulating film formed on the first insulating film,
    wherein a concentration of any one of nitrogen, oxygen, hydrogen and fluorine included in the first insulating film is higher than the concentration included in the second insulating film to cause the first insulating film to have a lower membrane stress than the second insulating film,
    wherein the first insulating film having a higher concentration of any one of nitrogen, oxygen, hydrogen, and fluorine than the second insulating film directly contacts the semiconductor layer,
    wherein the semiconductor device has a source electrode and a drain electrode formed in contact with the first semiconductor layer or the second semiconductor layer,
    wherein an opening is formed in the second semiconductor layer, and
    the gate electrode is formed in the inside of the opening, and
    wherein the insulating film is formed by an amorphous film, wherein carbon is a chief ingredient of the amorphous film.

4. A power-supply unit including a semiconductor device, comprising:
    a semiconductor layer formed above a substrate;
    an insulating film formed on the semiconductor layer; and
    an electrode formed on the insulating film,
    wherein the insulating film includes a first insulating film and a second insulating film formed on the first insulating film,
    wherein a concentration of any one of nitrogen, oxygen, hydrogen and fluorine included in the first insulating film is higher than the concentration included in the second insulating film to cause the first insulating film to have a lower membrane stress than the second insulating film,
    wherein the first insulating film having a higher concentration of any one of nitrogen, oxygen, hydrogen, and fluorine than the second insulating film directly contacts the semiconductor layer,
    wherein the semiconductor device is included in one of a power supply unit and an amplifier, and
    wherein the insulating film is formed by an amorphous film, wherein carbon is a chief ingredient of the amorphous film.

* * * * *